United States Patent [19]

McCarthy, deceased et al.

[11] Patent Number: 5,180,230

[45] Date of Patent: Jan. 19, 1993

[54] ROLLING ELEMENT CAGE CONSTRAINT

[75] Inventors: Donald J. McCarthy, deceased, late of Hayward, by Darleen D. McCarthy, executor; Manuel Pastor, Berkeley, both of Calif.

[73] Assignee: ETEC Systems, Inc., Hayward, Calif.

[21] Appl. No.: 713,929

[22] Filed: Jun. 12, 1991

[51] Int. Cl.⁵ ............................................. F16C 29/04
[52] U.S. Cl. ........................................ 384/54; 384/49; 384/51
[58] Field of Search ................... 384/9, 10, 49, 50, 51, 384/54

[56] References Cited

U.S. PATENT DOCUMENTS

| | | | |
|---|---|---|---|
| 2,967,741 | 1/1961 | Bostelmann | 384/49 |
| 3,563,617 | 2/1971 | Pritchard | 384/49 |
| 4,262,974 | 4/1981 | Tojo et al. | 384/54 |
| 4,974,291 | 11/1990 | Mottate | 384/49 X |

FOREIGN PATENT DOCUMENTS

| | | | |
|---|---|---|---|
| 60718 | 5/1980 | Japan | 384/49 |
| 155325 | 7/1987 | Japan | 384/49 |
| 750161 | 7/1980 | U.S.S.R. | 384/49 |

*Primary Examiner*—Thomas R. Hannon
*Attorney, Agent, or Firm*—Skjerven, Morrill, Macpherson, Franklin & Friel

[57] ABSTRACT

A linear bearing assembly comprising sets of guides (ways) for guiding rolling elements (ball bearings or rollers) constrained within a cage. Typically, two sets of rolling elements and cages are used between a moving part and a stationary part. Each set has four resilient elements (springs) with one end of each spring anchored to the cage and with the other ends of two springs anchored to the stationary way or part and the other ends of the other two springs are anchored to the movable way or part. This arrangement provides a restoring spring force that gradually forces the cage to its correct tracking position. If the cage is tracking properly, the spring forces cancel out and there is no inherent rubbing in the restoring mechanism.

6 Claims, 4 Drawing Sheets 5,180,230

ROLLING ELEMENT CAGE CONSTRAINT

BACKGROUND OF THE INVENTION

This invention relates to an improvement in linear bearing assemblies and is particularly directed to a means of restraining rolling element cages and rolling elements to prevent their migration away from the center position.

In linear bearing assemblies with roller elements (rollers or ball bearings), the rolling elements tend to migrate. Migration is caused primarily by imperfections in the components, misalignment, and/or variations in the load on the rolling elements and cage.

This may not be a problem in leadscrew or other high force drive systems as stops at the ends of the bearings will relocate the rolling elements and their cage. When it is not permissable to hit stops at the end of travel or, if the drive forces are not strong enough, to keep the rolling elements and cages in place, rack and pinions, pulleys and filaments have been used. These mechanisms are bulky and have rubbing surfaces requiring additional forces to be applied.

When the available driving force is limited, however, another means is necessary to keep the rolling elements from migrating very far or not at all and this invention is directed toward this end. This is particularly important where movement of the apparatus is controlled to submicron distances, step-by-step, as in an X-Y table in an inspection microscope or a particle beam machine for making semiconductor wafers and masks.

It is therefore an object of this invention to improve linear bearing assemblies by providing a means for reducing or preventing migration of the rolling elements.

Another object of this invention is to provide a means in a linear bearing assembly which reduces or prevents migration of the rolling elements without providing bulk and without rubbing surfaces which require additional forces to be applied to overcome the friction of the rubbing surfaces.

Another object of this invention is to improve an X-Y table for a particle beam machine for precise positioning of the top surface of the table which is critical to the proper operation of the particle beam machine.

SUMMARY OF THE INVENTION

The improved linear bearing assembly which meets the foregoing objects comprises sets of guides (ways) for guiding rolling elements (ball bearings or rollers) constrained within a cage. Typically, two sets of rolling elements and cages are used between a moving part and a stationary part and each set has four resilient elements (springs) with one end of each spring anchored to the cage and with the other ends of two springs anchored to the stationary way or part and the other ends of the other two springs are anchored to the movable way or part. This arrangement provides a restoring spring force that gradually forces the cage to its correct tracking position. If the cage is tracking properly, the spring forces cancel out and there is no inherent rubbing in the restoring mechanism. With this arrangement, also, there are no other sliding or rubbing components which would otherwise require additional driving forces.

At the heart of the invention is the fact that the restoring force applied to the cage and balls can be very small compared to the force required to push the balls for a long distance along the raceway. When shifting the ball and cage, it is not necessary to overcome the friction forces due to the preload and weight of the stage. Instead, a force is applied to the cage very lightly but continuously. These minute forces, however, are enough to change the rolling pattern at the interface of the balls and raceway and the whole cage and ball complement are kept nearly on track.

DETAILED DESCRIPTION

Figure 1:
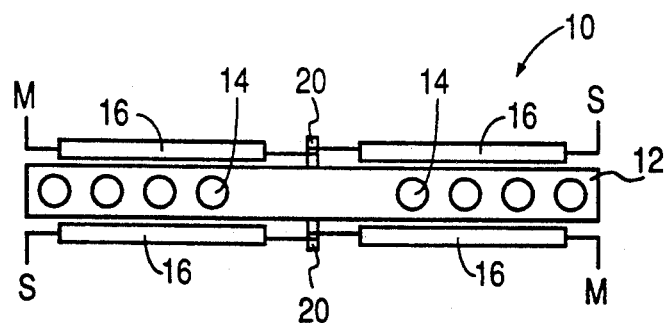
FIG. 1 is a schematic illustration of the improved linear bearing assembly of this invention.

FIG. 1 is a schematic illustration of the improved linear bearing assembly of this invention, denoted as 10, with a cage 12 containing a plurality of rolling elements (ball bearings) 14 and four resilient elements (coil springs) 16. One end of each spring 16 is anchored centrally to the cage 12 by pins 20 and the other end of each spring 16 is attached to ways, denoted as S and M, representing stationary ways and movable ways, respectively. This illustration also shows how the cage is subjected to four springs while the stationary and movable ways are subjected to only two springs.

FIGS. 2-7 illustrate one application of this invention in an X-Y table of a particle or electron beam lithography (EBL) machine but it should be understood that this invention may be used wherever cage migration is a problem.

Figure 2:
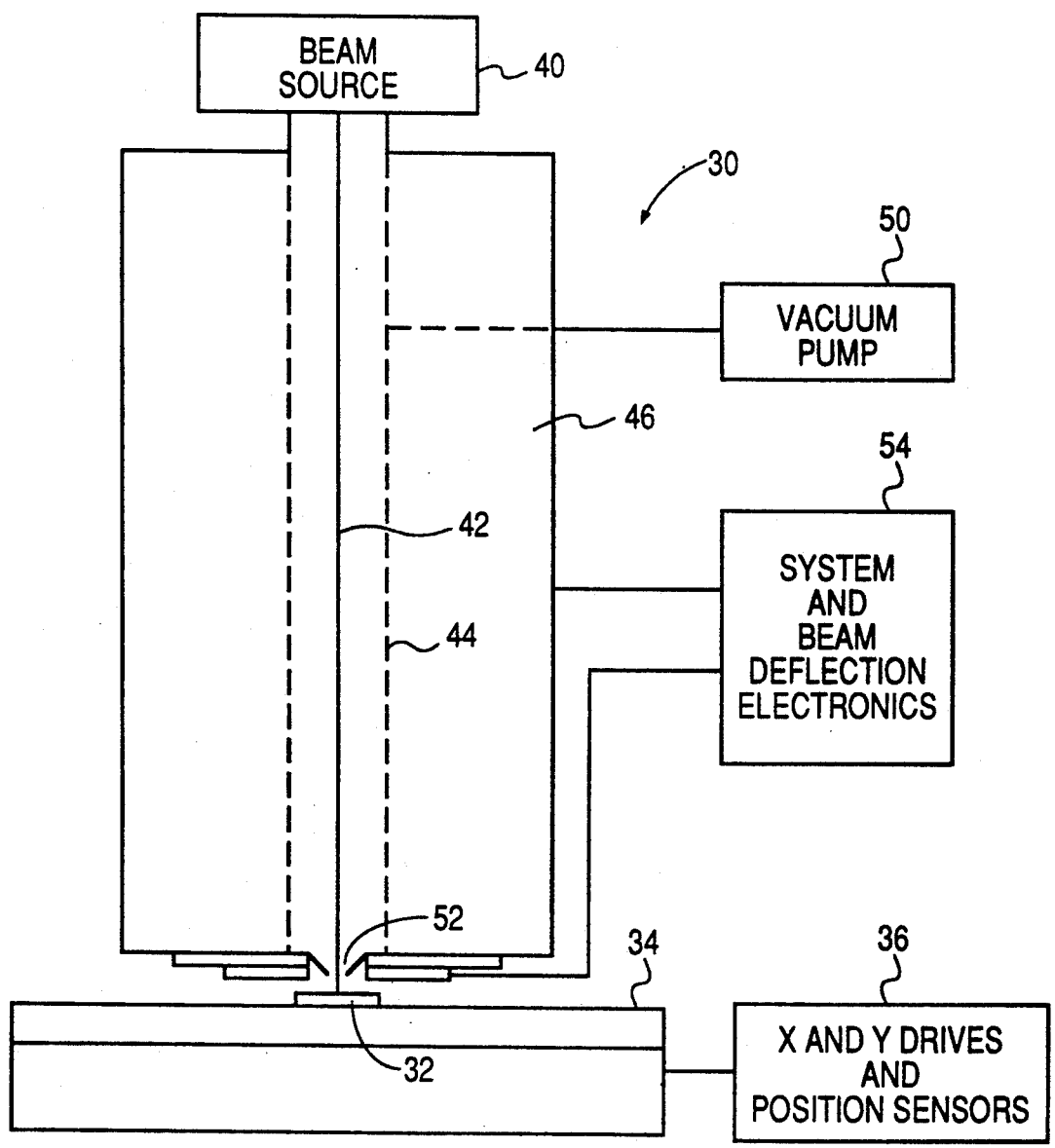
FIG. 2 is a schematic illustration of an EBL machine in which the present invention is incorporated.

Thus, FIG. 2 schematically illustrates an EBL machine 30 for processing a workpiece 32, also called a substrate, such as a semiconductor wafer or a mask. The workpiece 32 is supported on a chuck (not shown) and is held in position on a movable stage 34 which is translated in the X and Y directions by an X-Y drive system and the position of the stage is sensed by position sensors, typically interferometers, all of which are represented by a block diagram 36. The complete EBL machine 30 includes, among other things, a beam source 40 for beam 42, a central tube 44 (shown in phantom) within a beam column 46 and maintained by a high vacuum pump 50 coupled to the beam column 46. The beam 42 passes through an opening 52 in the beam column 46 and impinges on the workpiece 32. The EBL machine further includes, among other things, a controller and associated electronics which controls the beam, an X-Y drive system, a substrate handling system and means for storing pattern data and providing beam control signals, all represented by block 54.

Figure 3:
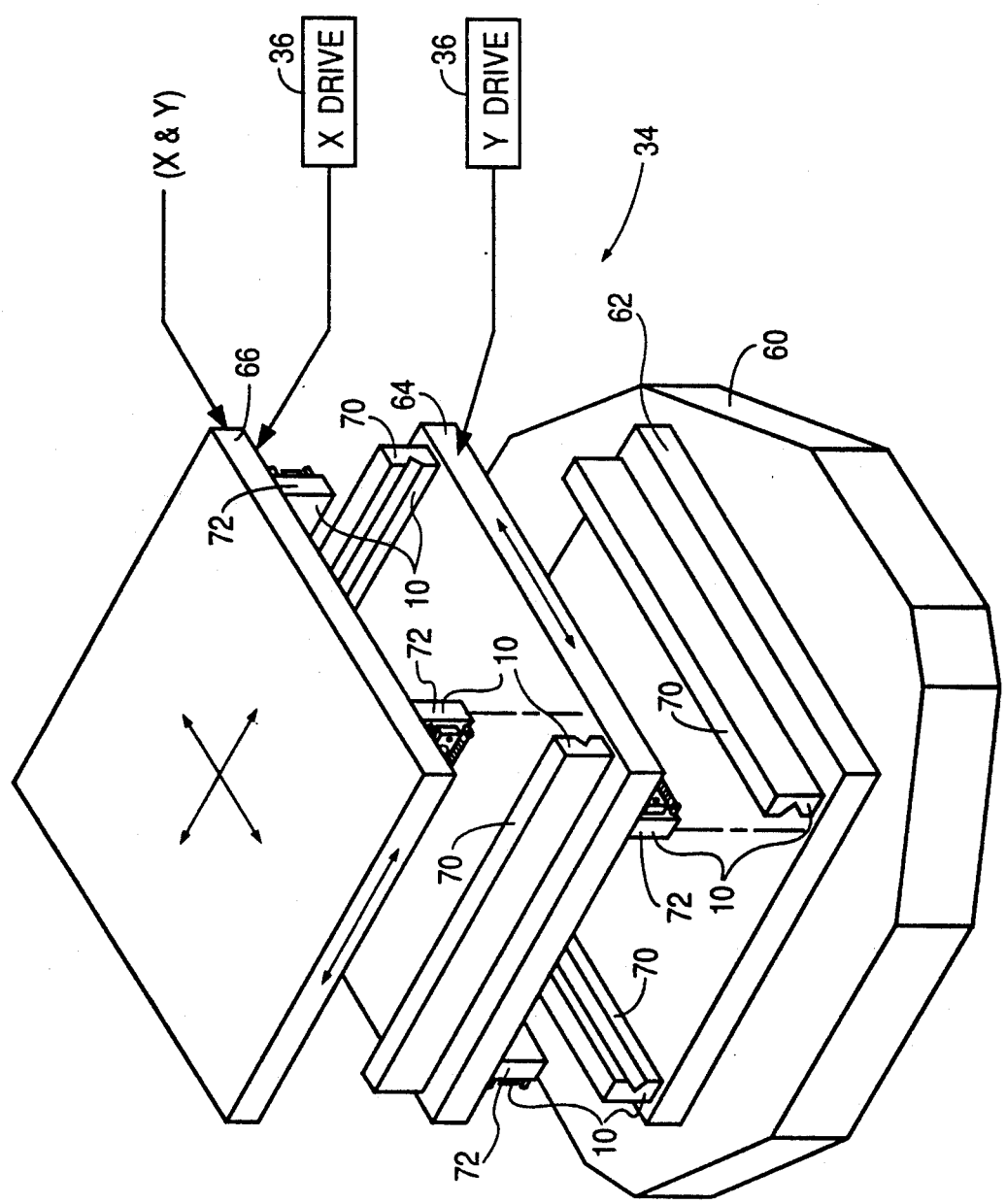
FIG. 3 is an exploded view of the X-Y table of FIG. 2.
Figure 4:
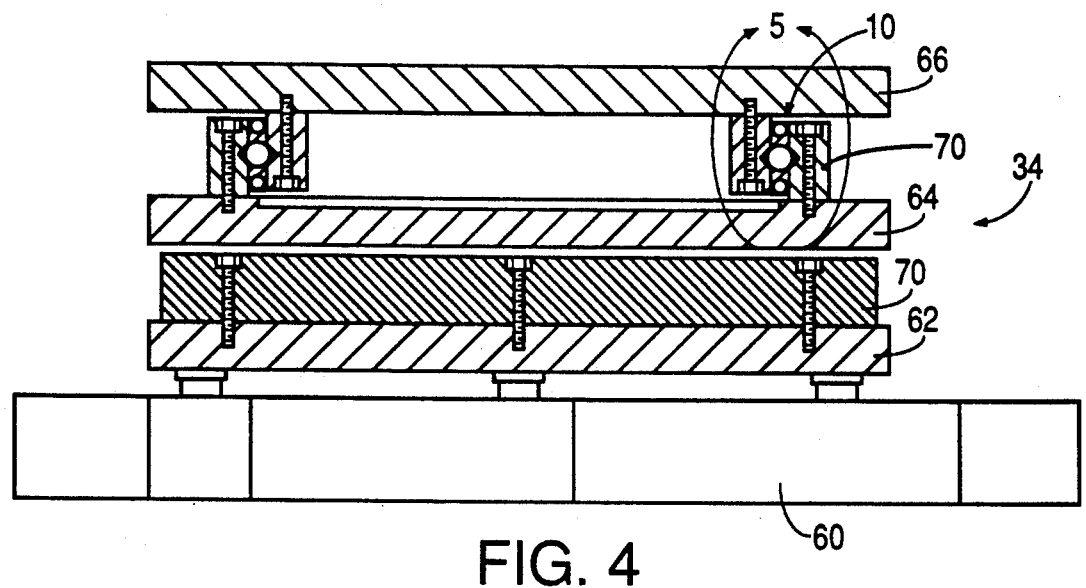
FIG. 4 is an elevational view, partially in section showing the relationship of the stages and linear bearing assemblies.
Figure 5:
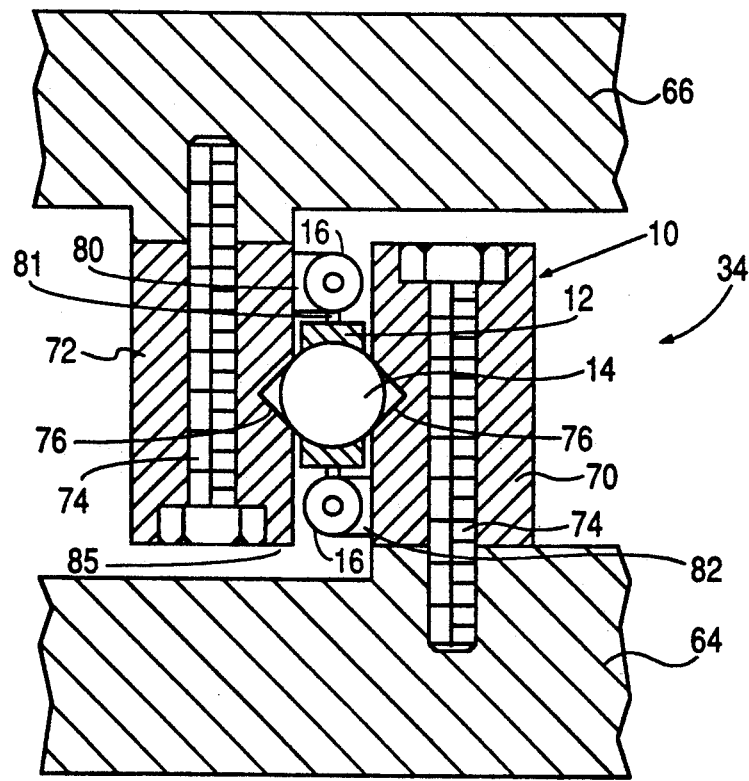
FIG. 5 is an enlarged view of the area encircled in FIG. 4.

As shown in FIGS. 3-5, the X-Y table 34 includes a base 60 which includes a first lower stationary plate (stage) 62 supported on the base 60, a second middle movable plate (stage) 64, spaced from said first stage 62 and providing movement in one direction, such as in the Y direction, and a third movable top plate (stage) 66 spaced from the second stage 64 which provides movement in the direction orthogonal to the second stage 64, such as in the X direction. The top stage 66 is thus movable in both the X and Y directions.

For orthogonal movement of stages 64 and 66, there is provided sets of linear bearing assemblies 10 between stages 44 and 46 and between stages 44 and 42 with each set of linear bearing assemblies 10 oriented orthogonally. Each bearing assembly 10 includes a stationary way 70 (S in FIG. 1) and a movable way 72 (M in FIG. 1) with ball bearings 14 contained within cage 12 for anti-frictional movement between stages.

As shown in FIGS. 4, and 5, each way 70,72 is connected to the stages 44-46 in any suitable manner, as by bolts 74, and each way is spaced apart to accommodate the cage 12 and ball bearings 14. Each way is also provided with grooves 76 facing one another to provide the guidance and rolling capability for the ball bearings. FIG. 5 also shows one end of one spring 16 attached to one way by pin 80 and to cage 12 as at 81 and the other end of another spring 16 attached to the other way by pin 82 and to cage 12 as at 83.

Figure 6:
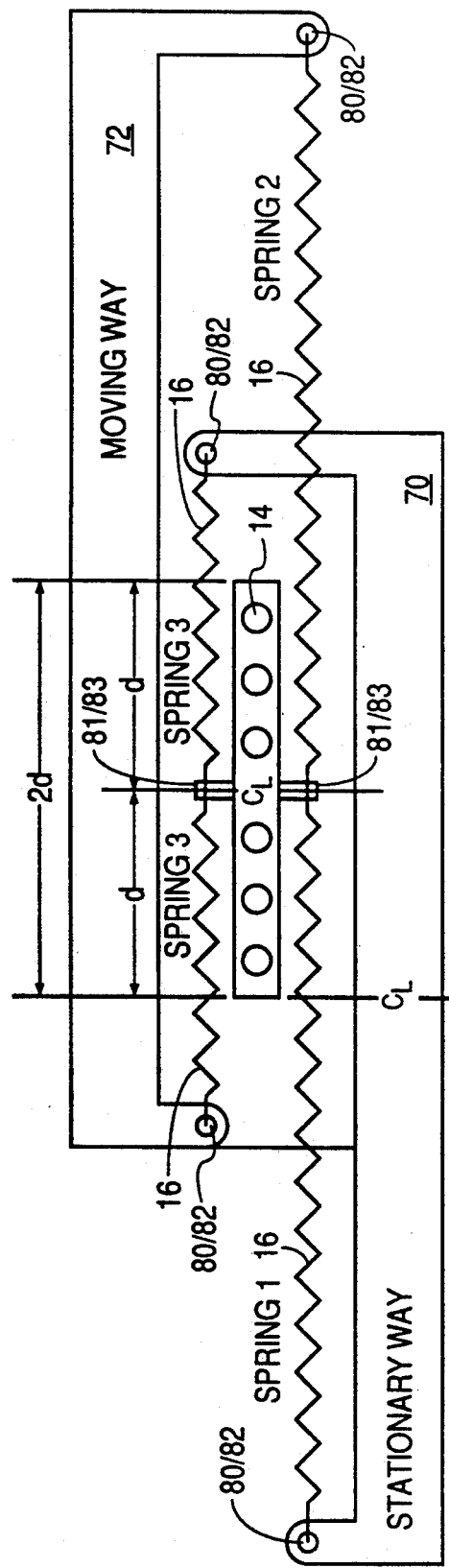
FIG. 6 is a schematic illustration of the relationship of the ways, the cage and the four springs.
Figure 7:
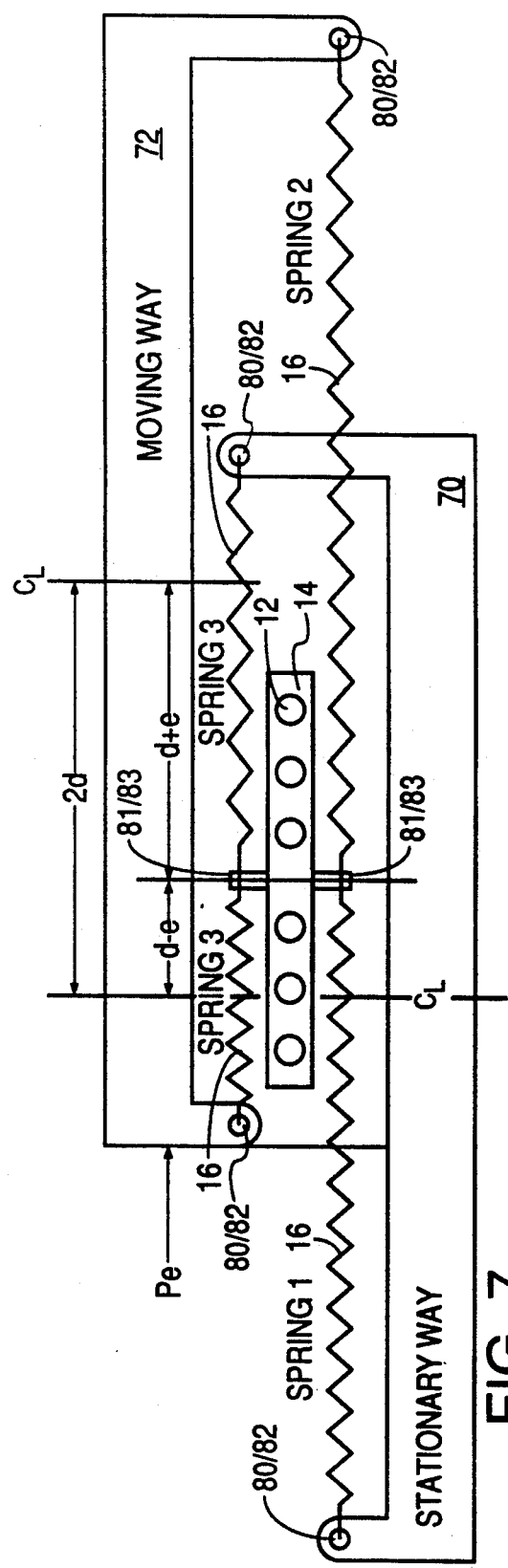
FIG. 7 is also a schematic illustration of the relationship of the ways, the cage and the four springs.

FIGS. 6 and 7 show the relationship between the springs 16 and way 72 and the centrally located pins 20 for connecting the springs to the ball cage 12.

In FIG. 6, the cage is shown in a no drift position. The four springs 16 in this view are identified as springs 1-4 for clarity. This Figure shows that springs 1 and 2 are stretched with an initial stretch of +d and the spring forces are canceled out and springs 3 and 4 have an initial stretch of −d and the spring forces cancel out. In FIG. 7, the cage 14 has migrated to the left by an amount e (arbitrarily chosen for illustration). In this view, the spring forces are not canceled out but a restoring force Pe in the right direction (as shown in the drawing) is required at the moving way. This restoring force is equal to 4ek, where k is the individual spring constant.

Again, when forces to be applied to the ways for movement is limited and the distance of such movement being at the submicron level, it can be appreciated that this invention provides for the reduction or elimination of migration of the rolling elements to assure precise positioning between a movable part and a stationary part, for example, in the X and Y stages of an X-Y stage of a EBL machine where movement of such stages is a step-by-step process and the distances are submicron.

With the spring arrangement shown in FIGS. 5-7, the restoring force applied to the cage is 4ke where k is the individual spring rate and e is the migration distance on a carefully built 6" stage.

In a system without springs, the cage migrated between $1.8 \times 10^{-7}$ and $9.6 \times 10^{-7}$ inches per each inch of stage travel. This represents up to 0.58" migration/100,000 cycles, an unacceptable value. By applying a force to the cages in this system, it was determined that the cage moved at the rate of $5.3 \times 10^{-4}$ inches/inch stage travel for each pound of applied force. This means that the forces inducing migration are equivalent to:

$$\frac{9.6 \times 10^{-7} \text{ in/in}}{5.3 \times 10^{-4} \text{ in/in}^{-lb}} = .0018$$

A system built with four springs of 0.019 lb/inch would apply a restoring force of $4 \times 0.019$ lb/inch migration. Migration in this system would be limited to:

$$\frac{.0018^{lb}}{4 \times .019^{lb}/\text{in}} = .024 \text{ inches}$$

In the case of a less precisely built stage with 10 times more intrinsic migration. The cage would never migrate beyond 0.24 inches, still an acceptable value.

Finally, while the aboved described preferred embodiment utilizes four springs, other combinations of springs are feasible. For example, two springs coupled to the ways and the cage as taught above may be used and, similarly, eight springs attached as taught above may be used. The use of four springs provides a preferred balance of all of the forces.

We claim:

1. A linear bearing assembly comprising:
   a stationary part having two ends,
   a movable part having two ends,
   a sliding component permitting parallel displacement of said movable part in juxtaposition to said stationary part,
   and two resilient elements each having two ends, wherein
   one of the resilient elements having a first end affixed to a first end of the stationary part and the second end of said resilient element affixed to the sliding component, and
   the second resilient element having a first end affixed to the sliding component and the second end of said resilient element affixed to a first end of the movable part.

2. The linear bearing assembly as claimed in claim 1, further comprising:
   an additional pair of resilient elements each having two ends, wherein
   one of the additional pair of resilient elements having a first end affixed to the sliding component and the second end of said resilient element affixed to the second end of the stationary part, and
   the second of the additional pair of resilient elements having a first end affixed to the sliding component and the second end of said resilient element affixed to the second end of the movable part.

3. The linear bearing assembly as claimed in claim 1 wherein said sliding element consists of rolling elements constrained in a cage and guided by ways.

4. The linear bearing assembly as claimed in claim 1 wherein said resilient elements are coil springs.

5. In a lithography machine wherein a particle beam is directed through a beam column and onto a substrate and having a magnetic deflection assembly for positioning the beam within a field of a selected size and having an X-Y table for holding the substrate and moving the substrate in an X and Y direction, the improvement in said X-Y table comprising:
   a first stage and a second stage movable in one direction,
   sets of linear bearing assemblies, positioned between said first and second stages, each said linear bearing assembly comprising:
   a stationary part having two ends,
   a movable part having two ends,
   a sliding component permitting parallel displacement of said movable part in juxtaposition to said stationary part, and
   four resilient elements each having two ends, wherein to each end of the stationary part are affixed the first end of a resilient element, the second end of each such resilient element affixed to the sliding component, and to each end of the movable part are affixed the first end of another resilient element, the second end of each such resilient element affixed to the sliding component, a third stage movable with respect to said second stage, sets of linear bearing assemblies, positioned between said third state and second stage and positioned orthogonally to said previously mentioned sets for relative movement between said second stage and said third stage.

6. The lithography machine as claimed in claim 5 wherein said resilient elements are coil springs.

* * * * *